(12) United States Patent
Cheng et al.

(10) Patent No.: US 9,966,430 B2
(45) Date of Patent: May 8, 2018

(54) STACKED NANOWIRE DEVICE WIDTH ADJUSTMENT BY GAS CLUSTER ION BEAM (GCIB)

(71) Applicants: International Business Machines Corporation, Armonk, NY (US); GlobalFoundries, Inc., Grand Cayman (KY)

(72) Inventors: Kangguo Cheng, Schenectady, NY (US); Xin Miao, Guilderland, NY (US); Ruilong Xie, Schenectady, NY (US); Tenko Yamashita, Shenectady, NY (US)

(73) Assignees: INTERNATIONAL BUSINESS MACHINES CORPORATION, Armonk, NY (US); GLOBALFOUNDRIES, INC., Grand Cayman (KY)

( * ) Notice: Subject to any disclaimer, the term of this patent is extended or adjusted under 35 U.S.C. 154(b) by 0 days. days.

(21) Appl. No.: 15/202,983

(22) Filed: Jul. 6, 2016

(65) Prior Publication Data
US 2017/0084690 A1    Mar. 23, 2017

Related U.S. Application Data

(63) Continuation of application No. 14/861,326, filed on Sep. 22, 2015, now Pat. No. 9,437,501.

(51) Int. Cl.
*H01L 29/06* (2006.01)
*H01L 21/8238* (2006.01)
(Continued)

(52) U.S. Cl.
CPC .... *H01L 29/0673* (2013.01); *H01L 21/02236* (2013.01); *H01L 21/02532* (2013.01);
(Continued)

(58) Field of Classification Search
CPC ................... H01L 29/42392; H01L 21/02603
See application file for complete search history.

(56) References Cited

U.S. PATENT DOCUMENTS

2009/0152629 A1* 6/2009 Hu .................... H01L 21/28247
257/344
2013/0341704 A1* 12/2013 Rachmady ........ H01L 29/66545
257/327
(Continued)

OTHER PUBLICATIONS

Cheng, Kangguo, et al.; "Stacked Nanowire Device Width Adjustment by Gas Cluster Ion Beam (GCIB)"; U.S. Appl. No. 14/861,326, filed Sep. 22, 2015.
(Continued)

*Primary Examiner* — Moazzam Hossain
*Assistant Examiner* — Farun Lu
(74) *Attorney, Agent, or Firm* — Cantor Colburn LLP; Vazken Alexanian

(57) ABSTRACT

A method of making a nanowire device includes disposing a first nanowire stack over a substrate, the first nanowire stack including alternating layers of a first and second semiconducting material, the first semiconducting material contacting the substrate and the second semiconducting material being an exposed surface; disposing a second nanowire stack over the substrate, the second nanowire stack including alternating layers of the first and second semiconducting materials, the first semiconducting material contacting the substrate and the second semiconducting material being an exposed surface; forming a first gate spacer along a sidewall of a first gate region on the first nanowire stack and a second gate spacer along a sidewall of a second gate region on the second nanowire stack; oxidizing a portion of the first nanowire stack within the first gate spacer; and removing the first semiconducting material from the first nanowire stack and the second nanowire stack.

20 Claims, 14 Drawing Sheets

(51) Int. Cl.

| | | |
|---|---|---|
| H01L 21/84 | (2006.01) | |
| H01L 21/265 | (2006.01) | |
| H01L 21/02 | (2006.01) | |
| H01L 29/66 | (2006.01) | |
| H01L 29/775 | (2006.01) | |
| H01L 29/786 | (2006.01) | |
| H01L 29/423 | (2006.01) | |
| H01L 27/092 | (2006.01) | |
| H01L 27/12 | (2006.01) | |

(52) U.S. Cl.
CPC .. *H01L 21/02603* (2013.01); *H01L 21/26566* (2013.01); *H01L 21/823807* (2013.01); *H01L 21/84* (2013.01); *H01L 27/092* (2013.01); *H01L 27/0922* (2013.01); *H01L 27/1203* (2013.01); *H01L 29/42392* (2013.01); *H01L 29/66439* (2013.01); *H01L 29/66545* (2013.01); *H01L 29/66742* (2013.01); *H01L 29/66795* (2013.01); *H01L 29/775* (2013.01); *H01L 29/78606* (2013.01); *H01L 29/78618* (2013.01); *H01L 29/78654* (2013.01); *H01L 29/78684* (2013.01); *H01L 29/78696* (2013.01); *H01L 21/02238* (2013.01); *H01L 21/02252* (2013.01)

(56) References Cited

U.S. PATENT DOCUMENTS

2016/0211322 A1\* 7/2016 Kim ................ H01L 29/66795
2016/0240533 A1\* 8/2016 Oxland ................ H01L 27/092

OTHER PUBLICATIONS

Cheng, Kangguo, et al.; "Stacked Nanowire Device Width Adjustment by Gas Cluster Ion Beam (GCIB)"; U.S. Appl. No. 15/202,994, filed Jul. 6, 2016.
List of IBM Patents or Patent Applications Treated as Related—Date Filed: Jul. 14, 2016; 2 pages.

\* cited by examiner

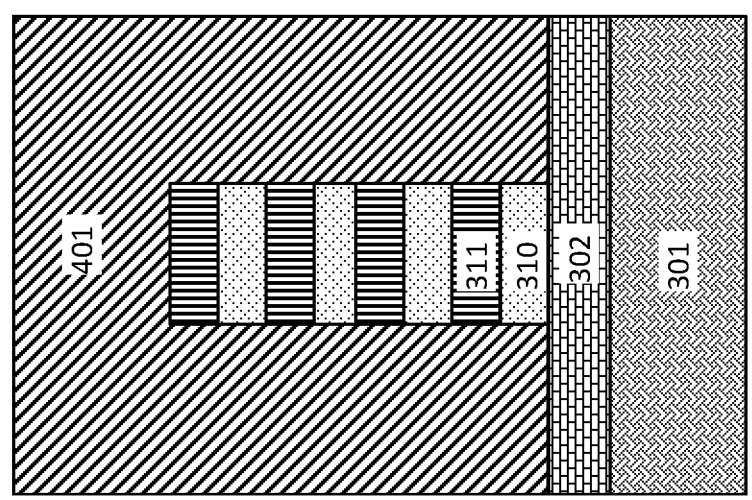

US 9,966,430 B2

STACKED NANOWIRE DEVICE WIDTH ADJUSTMENT BY GAS CLUSTER ION BEAM (GCIB)

DOMESTIC PRIORITY

This application is a continuation of and claims priority from U.S. patent application Ser. No. 14/861,326, filed on Sep. 22, 2015, entitled "STACKED NANOWIRE DEVICE WIDTH ADJUSTMENT BY GAS CLUSTER ION BEAM (GCIB)", the entire contents of which are incorporated herein by reference.

BACKGROUND

The present invention relates to complementary metal oxide semiconductors (CMOS), and more specifically, to CMOS nanowire devices.

CMOS is used for constructing integrated circuits. CMOS technology is used in microprocessors, microcontrollers, static random access memory (RAM), and other digital logic circuits. CMOS designs may use complementary and symmetrical pairs of p-type and n-type metal oxide semiconductor field effect transistors (MOSFETs) for logic functions.

As CMOS scales to smaller dimensions, nanowire devices provide advantages. Stacked nanowires provide area efficiency. Stacked nanowires provide, for example, increased drive current within a given layout area.

SUMMARY

According to an embodiment, a method of making a nanowire device includes disposing a first nanowire stack of a first transistor over a substrate, the first nanowire stack including alternating layers of a first semiconducting material and a second semiconducting material, the first semiconducting material contacting the substrate and the second semiconducting material being an exposed surface of the first nanowire stack; disposing a second nanowire stack of a second transistor over the substrate, the second nanowire stack including alternating layers of the first semiconducting material and the second semiconducting material, the first semiconducting material contacting the substrate and the second semiconducting material being an exposed surface of the second nanowire stack; forming a first gate spacer along a sidewall of a first gate region on the first nanowire stack and a second gate spacer along a sidewall of a second gate region on the second nanowire stack; oxidizing a portion of the first nanowire stack within the first gate spacer of the first gate region; and removing the first semiconducting material from the first nanowire stack and the second nanowire stack.

According to another embodiment, a method of making a nanowire device includes disposing a first nanowire stack of a first transistor over a substrate, the first nanowire stack including alternating layers of a first semiconducting material and a second semiconducting material, the first semiconducting material contacting the substrate and the second semiconducting material being an exposed surface of the first nanowire stack; disposing a second nanowire stack of a second transistor over the substrate, the second nanowire stack including alternating layers of the first semiconducting material and the second semiconducting material, the first semiconducting material contacting the substrate and the second semiconducting material being an exposed surface of the second nanowire stack; forming a first gate on the first nanowire stack and a second gate on the second nanowire stack, the first and second gates comprising a sacrificial gate material; removing the sacrificial gate material from the first gate and the second gate; disposing a mask over the second transistor; oxidizing a portion of the first nanowire stack; removing the mask and the first semiconducting material from the first nanowire stack and the second nanowire stack; and filling the first gate and the second gate with a high-k metal gate material.

Yet, according to another embodiment, a nanowire device includes a first transistor including a first gate disposed over a portion of a first nanowire stack, the first nanowire stack including a first semiconducting nanowire and a dielectric nanowire; and a second transistor comprising a second gate disposed over a portion of a second nanowire stack, the second nanowire stack including a second semiconducting nanowire and a third semiconducting nanowire.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 3-9B illustrate exemplary methods of making nanowire devices according to various embodiments, in which:

FIG. 3 is a cross-sectional side view of semiconductor stacks of a first nanowire field effect transistor (FET) and a second nanowire FET;

FIG. 4 is a cross-sectional side view after defining a dummy gate within the semiconducting stacks;

FIG. 5B is a cross-sectional side view through the A-A' axis of FIG. 5A;

FIG. 9B is a cross-sectional side view through the A-A' axis of FIG. 9A.

DETAILED DESCRIPTION

Figure 1:
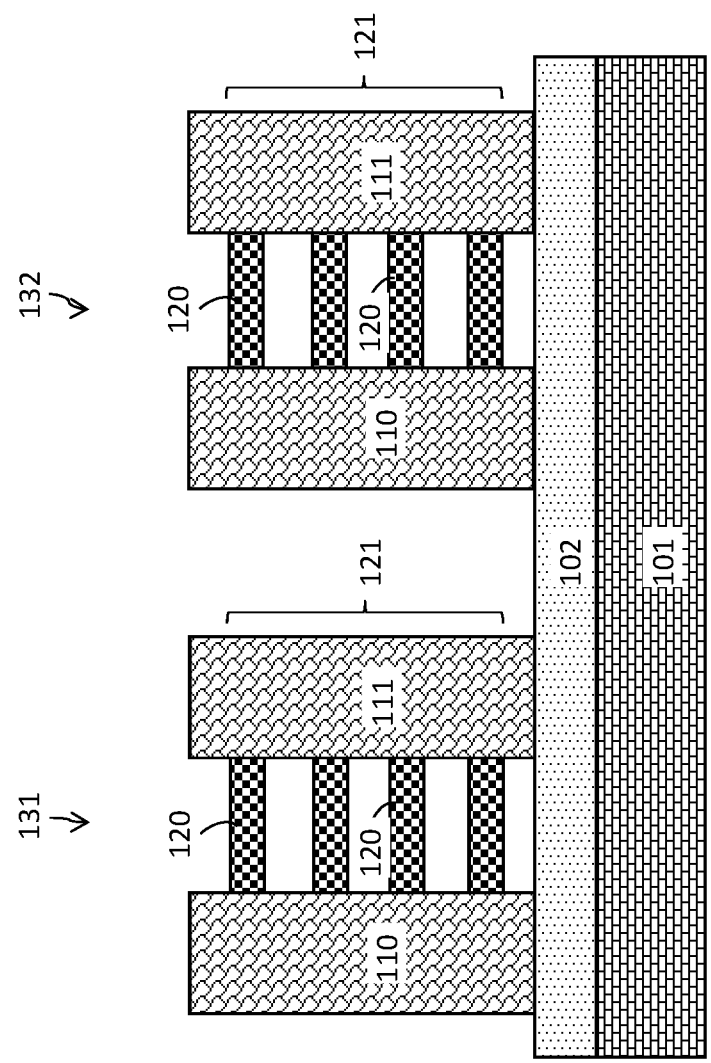
FIG. 1 is a cross-sectional side view of a comparative nanowire device.

Although efficient, nanowire transistor devices may have fixed device widths. The minimum device width is limited to the width of a nanowire stack. However, some applications may need flexible effective device widths that are beyond the integral number of nanowires in nanowire stacks. For example, static random access memory (SRAM) devices use NFET and PFET devices in a ratio that may be a fractional number, e.g., 1.5, instead of an integral value, e.g., 1 or 2.

Accordingly, various embodiments provide nanowire devices and methods of making nanowire devices with tunable effective device widths. Devices with tunable device widths are formed by converting one or more nanowires in a semiconducting stack into dielectric nanowires. In some embodiments, the semiconducting nanowires are converted to dielectric nanowires after dummy gate removal so that a majority of the front end of line (FEOL) processes remains undisrupted. In other embodiments, the nanowires are converted by performing a gas cluster ion beam (GCIB) process at room temperature. The thermal budget impact on junctions is minimized because high temperatures are not used. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Turning now to the Figures, FIG. 1 is a cross-sectional side view of a comparative nanowire device. The comparative nanowire device includes a first transistor 131 and a second transistor 132. The first and second transistors 131, 132 include stacks 121 of semiconducting silicon nanowires 120 disposed over buried oxide (BOX) layers 102 of a substrate 101. The stacks 121 include multiple nanowires 120, for example, two or more nanowires 120. The stack 121 in FIG. 1 includes four nanowires 120. Source 110 and drain 111 are formed on opposing ends of the nanowires 120. A gate (not shown) is disposed between the source 110 and drain 111.

In FIG. 1, the first transistor 131 includes 4 nanowires 120. The second transistor 132 includes 4 nanowires 120. Accordingly, the device width ratio between the first transistor 131 and the second transistor 132 is 4:4 (4 nanowires 120 in the first transistor 131 and 4 nanowires 120 in the second transistor 132). When the first transistor 131 and the second transistor 132 include the same number of nanowires 120, the device width ratio is fixed.

Figure 2:
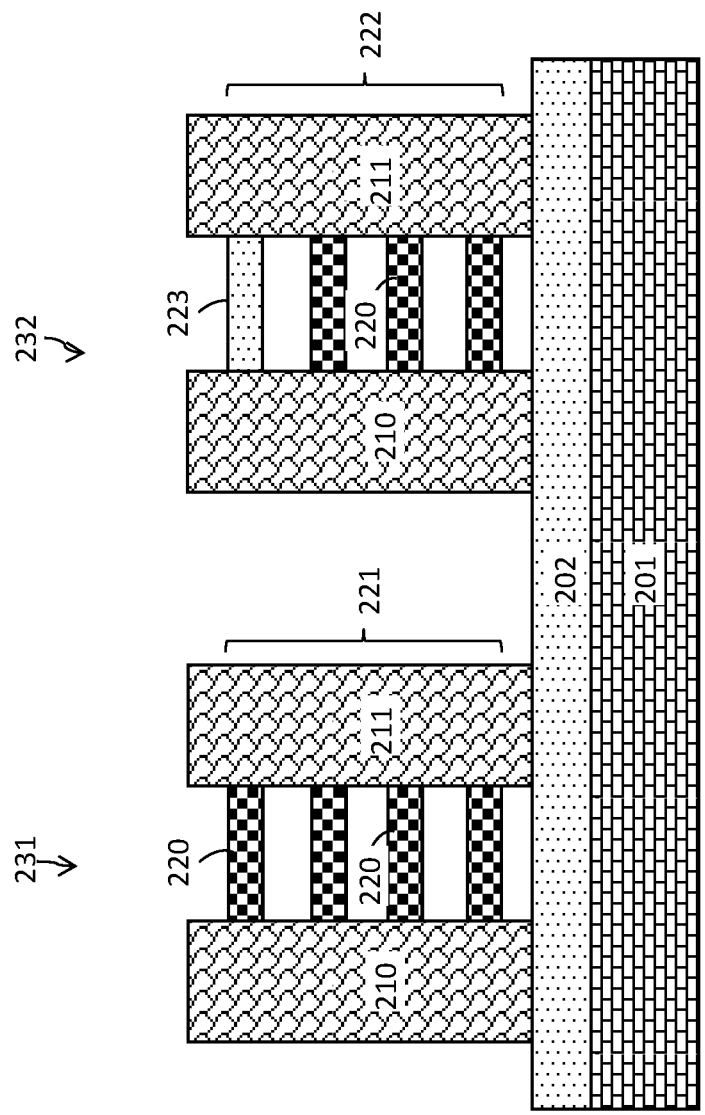
FIG. 2 is a cross-sectional side view of a nanowire device according to various embodiments.

FIG. 2 is a cross-sectional side view of a nanowire device according to various embodiments, which includes a tunable device width ratio. The nanowire device includes a first transistor 231 and a second transistor 232. The first transistor 231 includes a stack 221 of nanowires 220 disposed over a BOX layer 202 of a substrate 201. The nanowires 220 include a semiconducting material, for example, silicon. The stack 221 includes multiple nanowires 220, for example, two or more nanowires 220. For illustrative purposes, the stack 221 includes four nanowires. Although any number of nanowires 220 may be included in the stack 221.

The second transistor 232 includes a stack 222 of nanowires 220 disposed over BOX layer 202 of substrate 201. The stack 222 includes at least one nanowire 220. Nanowire 220 includes a semiconducting material, for example, silicon. The stack 222 includes at least one nanowire 223 that includes a dielectric material, e.g., a dielectric oxide. At least one semiconducting nanowire 220 is converted to a dielectric nanowire in the gate region between the source and drain 210, 211. The stack 222 may include more than one dielectric nanowire 223 and more than one semiconducting nanowire 220. For illustrative purposes, the stack 222 includes one dielectric nanowire 223 and three semiconducting nanowires 220. Thus, the nanowire device has a device width ratio between the first transistor 231 and second transistor 232 of 4:3. The nanowire device has a device width ratio between the second transistor 232 and the first transistor 231 of 3:4, which is also a non-integral value.

The effective device width is tunable by converting one or more nanowires from a semiconducting nanowire 220 to a non-semiconducting dielectric nanowire 223 in at least one transistor, as shown for second transistor 232.

Figure 3:
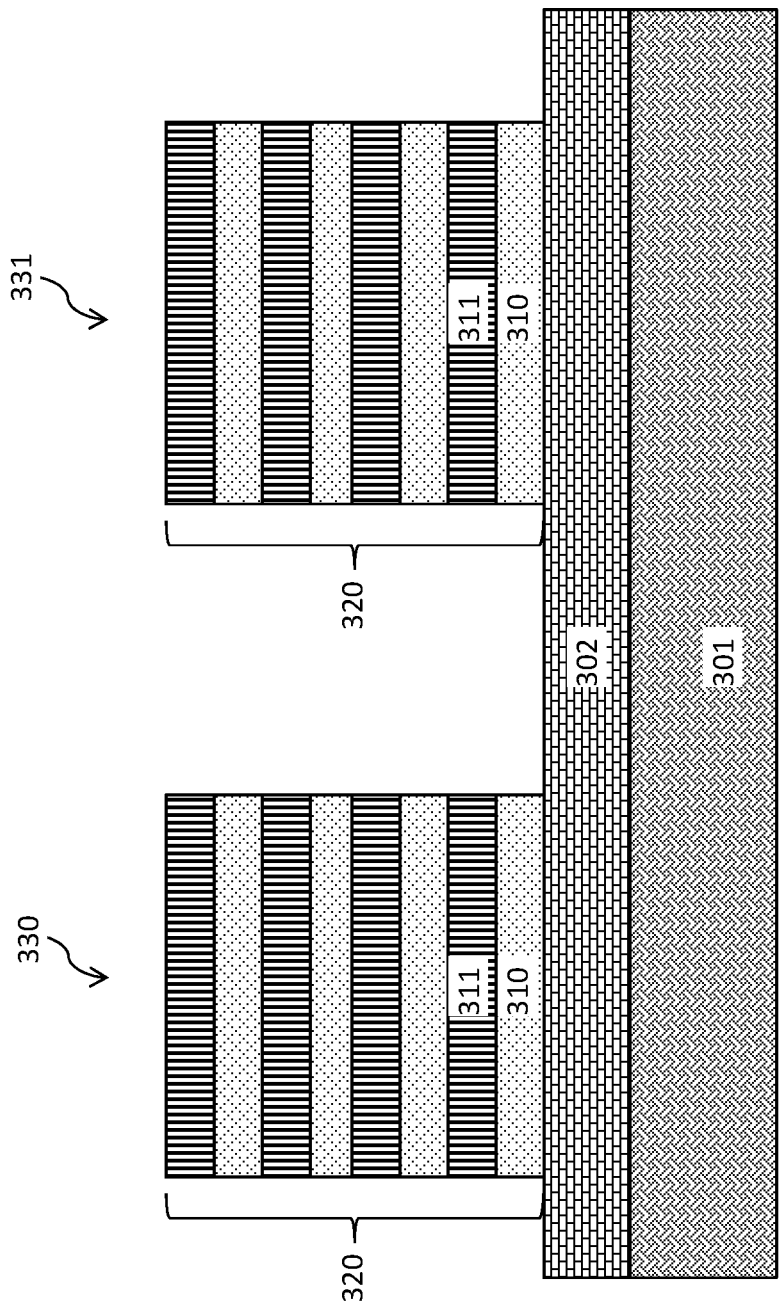

FIGS. 3-9B illustrate exemplary methods of making nanowire devices according to various exemplary embodiments. FIG. 3 is a cross-sectional side view of a nanowire device including a first transistor 330 and a second transistor 331. First and second transistors 330, 331 include a substrate 301. Non-limiting examples of suitable substrate 301 materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. In some embodiments, the substrate 301 of the first transistor 330 includes different materials than the substrate 301 of the second transistor 331.

The thickness of the substrate 301 generally varies and is not intended to be limited. In one aspect, the thickness of the substrate is in a range from about 10 nanometers (nm) to about 10 mm. In another aspect, the thickness of the substrate is in a range from about 1 um to about 1 mm.

A buried oxide (BOX) 302 is disposed over the substrate 301. The BOX 302 is an isolation region formed by etching trenches in the substrate 301 and then filling the trenches with, for example, silicon dioxide ($SiO_2$). Alternatively, the trenches may be lined with a silicon dioxide liner formed by a thermal oxidation process and then filled with additional silicon dioxide or another material. Non-limiting examples of suitable oxide materials for the BOX 302 include silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or any combination thereof.

The thickness of the BOX 302 generally varies and is not intended to be limited. In one aspect, the thickness of the BOX 302 is in a range from about 10 nm to about 10 micrometers (µm). In another aspect, the thickness of the BOX 302 is in a range from about 10 nm to about 100 nm.

In one exemplary embodiment, another layer of a semiconducting material (not shown) is disposed over the BOX 302 to form a silicon-on-insulator (SOI) wafer. The semiconducting material can include, but is not limited to, Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof. In some embodiments, the BOX 302 and substrate 301 defined a substrate onto which first and second transistors 330, 331 are formed.

First and second transistors 330, 331 include stacks 320 (first and second nanowire stacks, respectively) of alternating semiconducting materials that are disposed over the BOX 302 (or substrate 301). Stacks 320 include a first semiconducting material 310 and a second semiconducting material 311. The first and second semiconducting materials 310, 311 alternate within the stacks 320. In one embodiment, the first semiconducting material 310 contacts the BOX 302 or the substrate 301. The second semiconducting material 311 defines an exposed opposing surface of the stacks 320. The stacks 320 are formed simultaneously over the BOX 302 and substrate 301.

The stack 320 includes any number of alternating layers of first and second semiconducting materials 310, 311. For illustrative purposes, stacks 320 include four alternating layers of first semiconducting material 310 and four alternating layers of second semiconducting material 311. Stacks 320 include, for example, about 1 to about 10 of each of first and second semiconducting materials 310, 311.

First and second semiconducting materials 310, 311 include a semiconducting material(s). First semiconducting material 310 is disposed onto the BOX 302. Non-limiting examples of semiconducting materials include silicon, silicon germanium, germanium, silicon carbide, III-V materials, II-VI materials, or any combination thereof. In one embodiment, first semiconducting material 310 includes silicon germanium, and second semiconducting material 311 includes silicon. In another embodiment, first semiconducting material 310 includes silicon, and second semiconducting material 311 includes silicon germanium.

The first semiconducting material 310 forms first semiconducting nanowires. The second semiconducting material 311 form second semiconducting nanowires. The thickness of the first and second semiconducting materials 310, 311 generally varies and is not intended to be limited. In one aspect, the thickness of each of the first or second semiconducting materials 310, 311 is in a range from about 1 nm to about 100 nm. In another aspect, the thickness of each of the first or second semiconducting materials 310, 311 is in a range from about 5 nm to about 30 nm.

Figure 4:
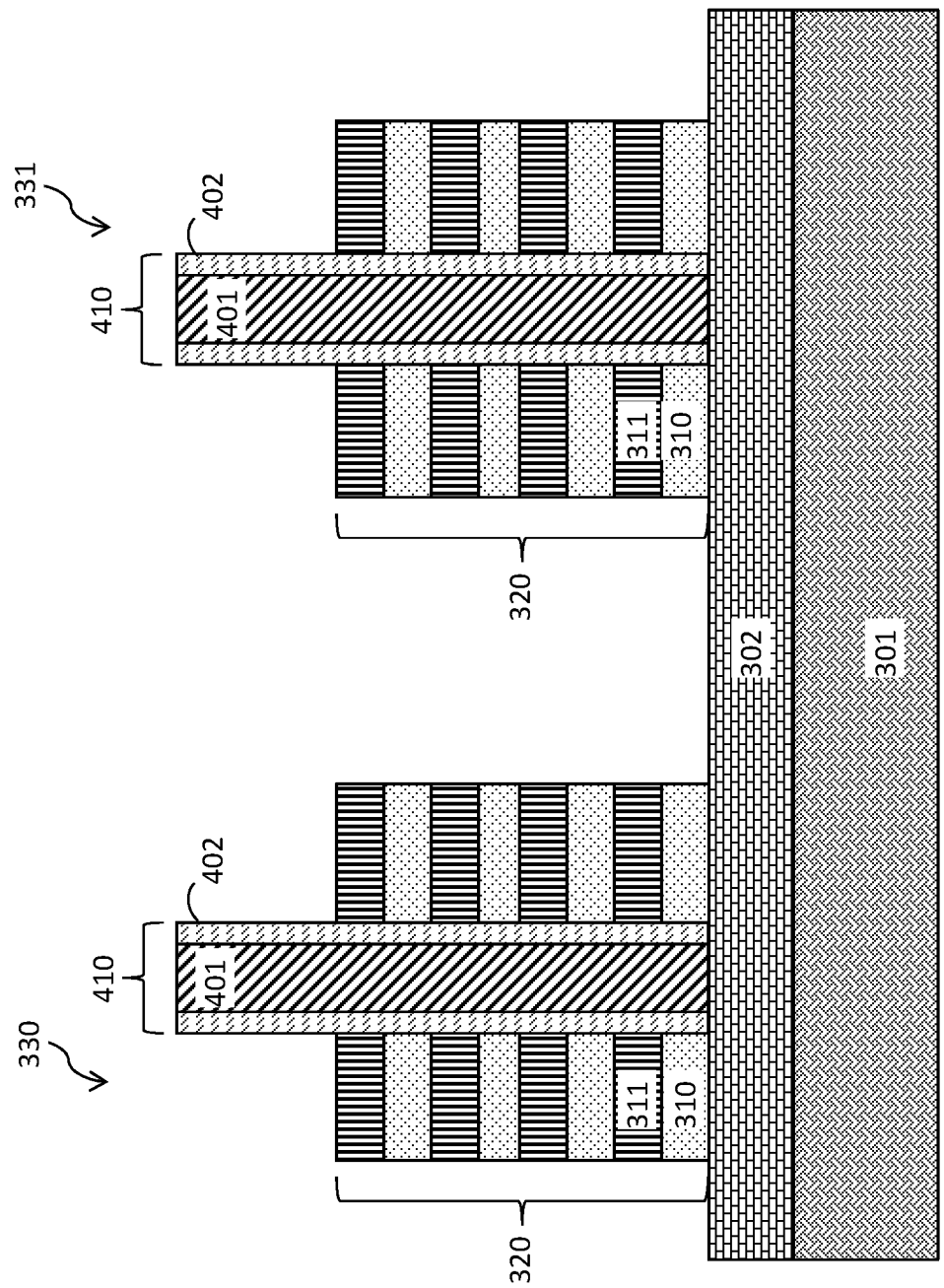

FIG. 4 is a cross-sectional side view after forming a dummy gate 410 on the stacks 320 of first and second transistors 330, 331. A first dummy gate is formed in the first transistor 330. A second dummy gate is formed in the second transistor 331. The dummy gate 410 defines a gate region. The dummy gate 410 includes a sacrificial gate material 401 surrounded by spacers 402. To form the dummy gate 410, the dummy gate 410 is formed by lithographic patterning and etching through the stacks 320. The sacrificial gate material 401 may include a suitable replacement gate material, for example, amorphous silicon (aSi) or polycrystalline silicon (polysilicon).

The gate spacers 402 include an insulating material. The spacers 402 may be etched by an anisotropic etching process, for example, reactive ion etching (ME). Non-limiting examples of suitable insulating materials for the gate spacers 402 include silicon dioxide ($SiO_2$), silicon nitride ($Si_3N_4$), SiOCN, or SiBCN, or any combination thereof. The spacers 402 form an insulating film along the gate sidewall to isolate the gate from the source/drain regions, which are described in FIG. 5A below. The thickness of the spacers 402 generally varies and is not intended to be limited. In one aspect, the thickness of the spacers 402 is in a range from about 1 nm to about 100 nm. In another aspect, the thickness of the spacers 402 is in a range from about 3 nm to about 20 nm.

Figure 5A:
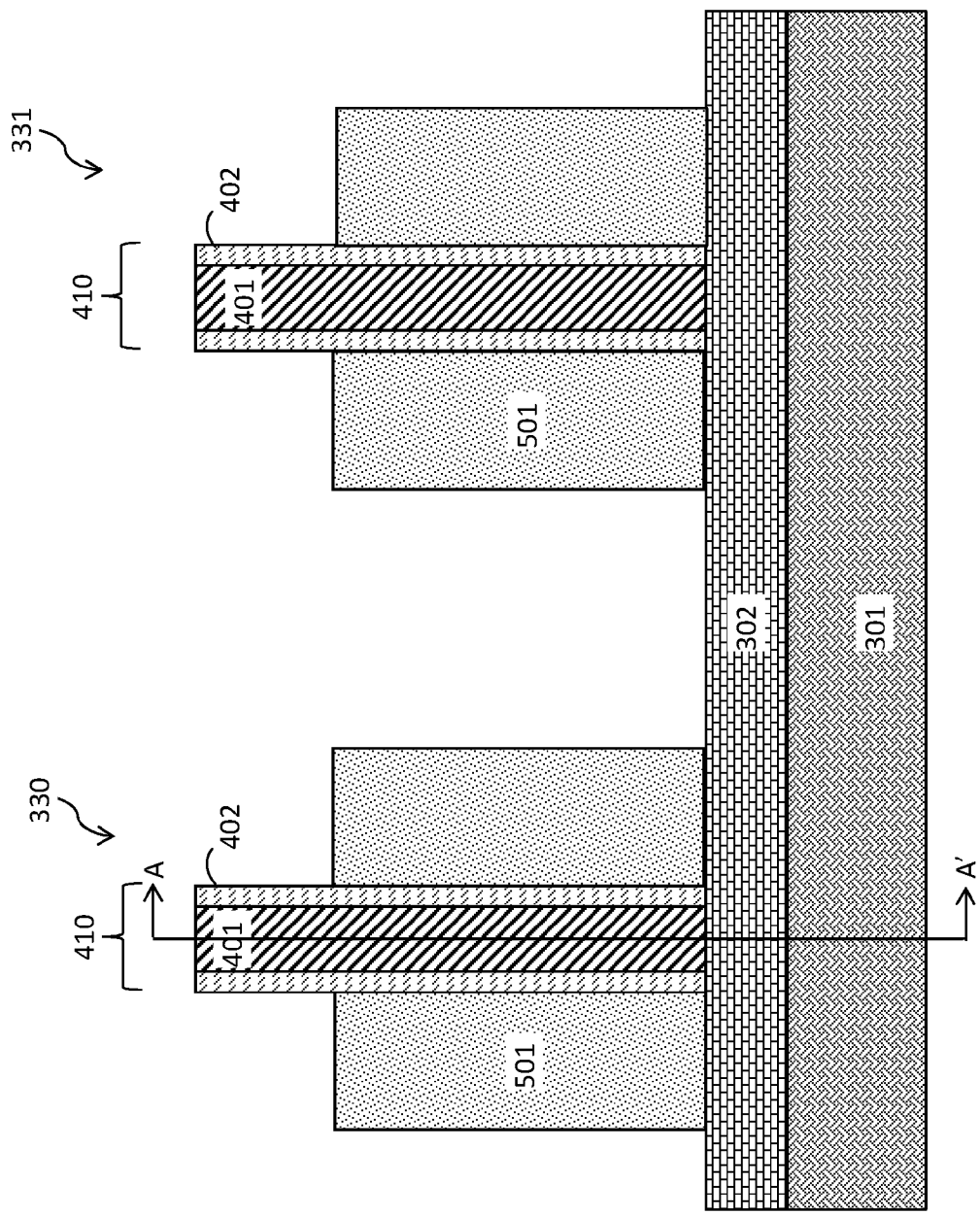
FIG. 5A is a cross-sectional side view after forming source and drain regions.

FIG. 5A is a cross-sectional side view after forming active areas 501 (source/drain regions) on opposing sides of the dummy gate 410. FIG. 5B is a cross-sectional side view through the A-A' axis of FIG. 5A. The active areas 501 may be formed by performing an epitaxial growth process. Alternatively, the active areas 501 may be formed by incorporating dopants into the stacks 320.

An epitaxial growth process deposits a crystalline layer onto a crystalline substrate beneath. The underlying stacks 320 (see FIG. 4) with first and second semiconducting materials 310, 311 function as a seed crystal. Non-limiting examples of suitable materials for the epitaxial growth forming the active areas 501 include silicon, silicon germanium, carbon doped silicon, III-V materials, II-VI materials, or any combination thereof. The epitaxial growth may be doped during deposition by adding a dopant or impurity to form a silicide. The dopant may be an n-type dopant (e.g., phosphorus or arsenic) or a p-type dopant (e.g., boron or gallium), depending on the type of transistor.

Figure 6A:
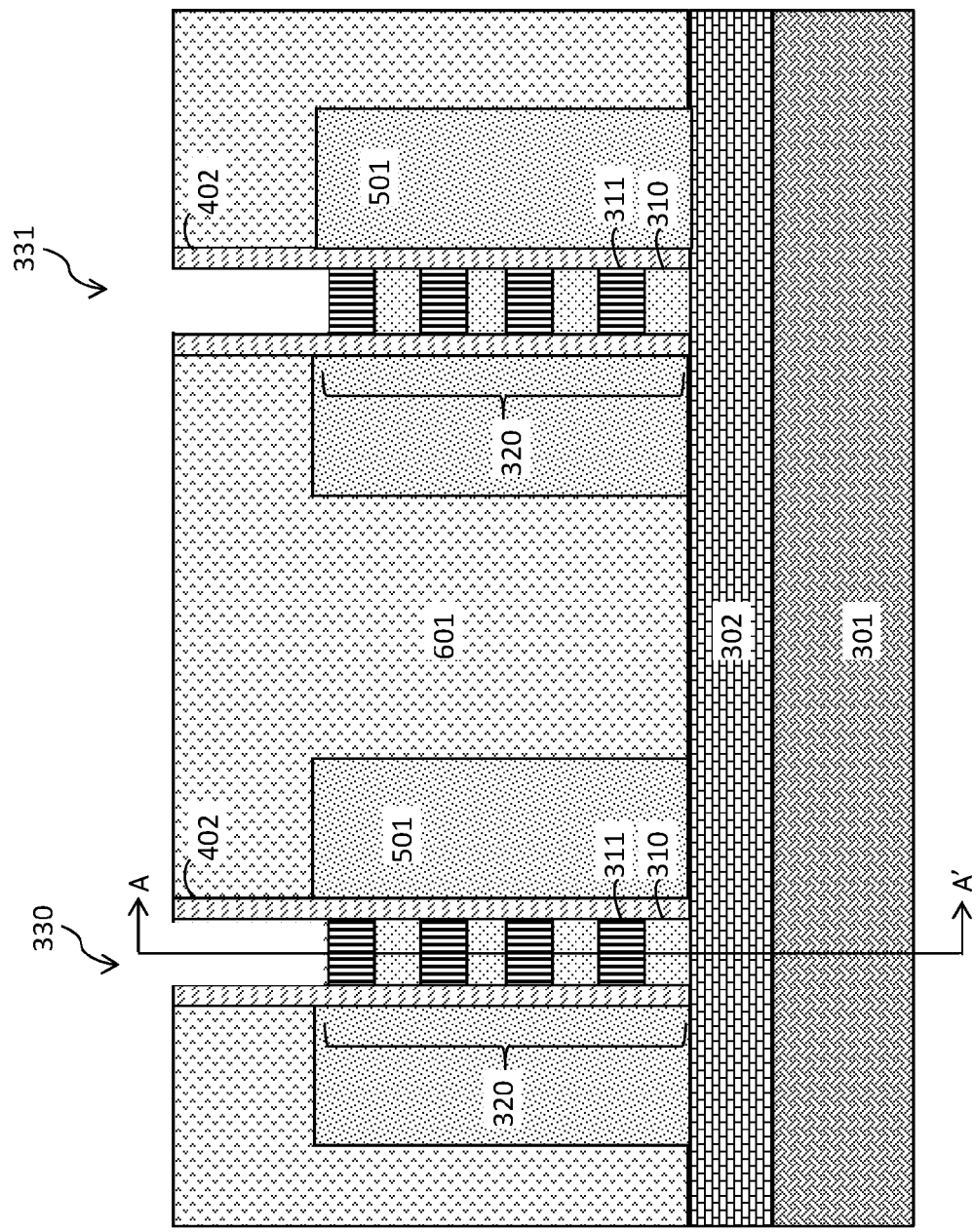
FIG. 6A is a cross-sectional side view after forming an inter-level dielectric (ILD) layer and removing the replacement gate material.
Figure 6B:
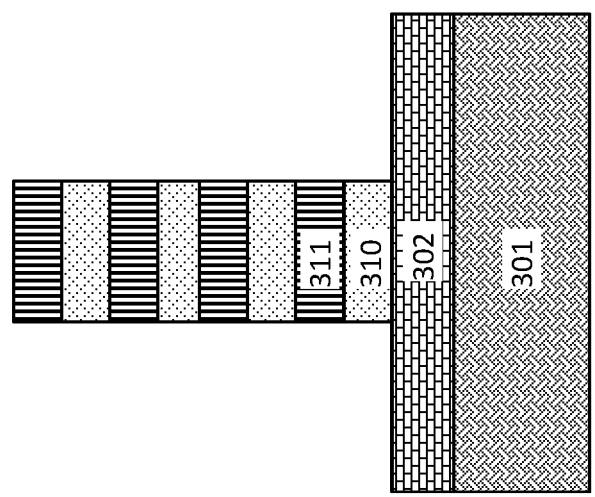
FIG. 6B is a cross-sectional side view through the A-A' axis of FIG. 6A.

FIG. 6A is a cross-sectional side view after disposing an interlevel dielectric (ILD) layer 601 over the active areas 501 and removing the sacrificial gate material 401 from the dummy gate 410. FIG. 6B is a cross-sectional side view through the A-A' axis of FIG. 6A.

The ILD layer 601 may include, for example, a low-k dielectric oxide, including but not limited to, silicon dioxide, spin-on-glass, a flowable oxide, a high density plasma oxide, borophosphosilicate glass (BPSG), or any combination thereof. The ILD layer 601 is deposited by a suitable deposition process, including, but not limited to CVD, PVD, plasma enhanced CVD, atomic layer deposition (ALD), evaporation, chemical solution deposition, or like processes.

A planarization process, for example, a chemical mechanical planarization (CMP) process is performed to expose the sacrificial gate material 401 within the spacers 402. An etching process is performed to remove the sacrificial gate material 401 from the first and second transistors 330, 331. The etching process may be a wet chemical etching process using an etchant substance. Non-limiting examples of chemical etchants include hydrofluoric acid (HF), hydrofluoric nitric acid (HNA), and phosphoric acid.

After removing the sacrificial gate material 401, the first and second semiconducting materials 310, 311 within the stacks 320 are exposed within the spacer 402 sidewalls of the first and second transistors 330, 331.

Figure 7A:
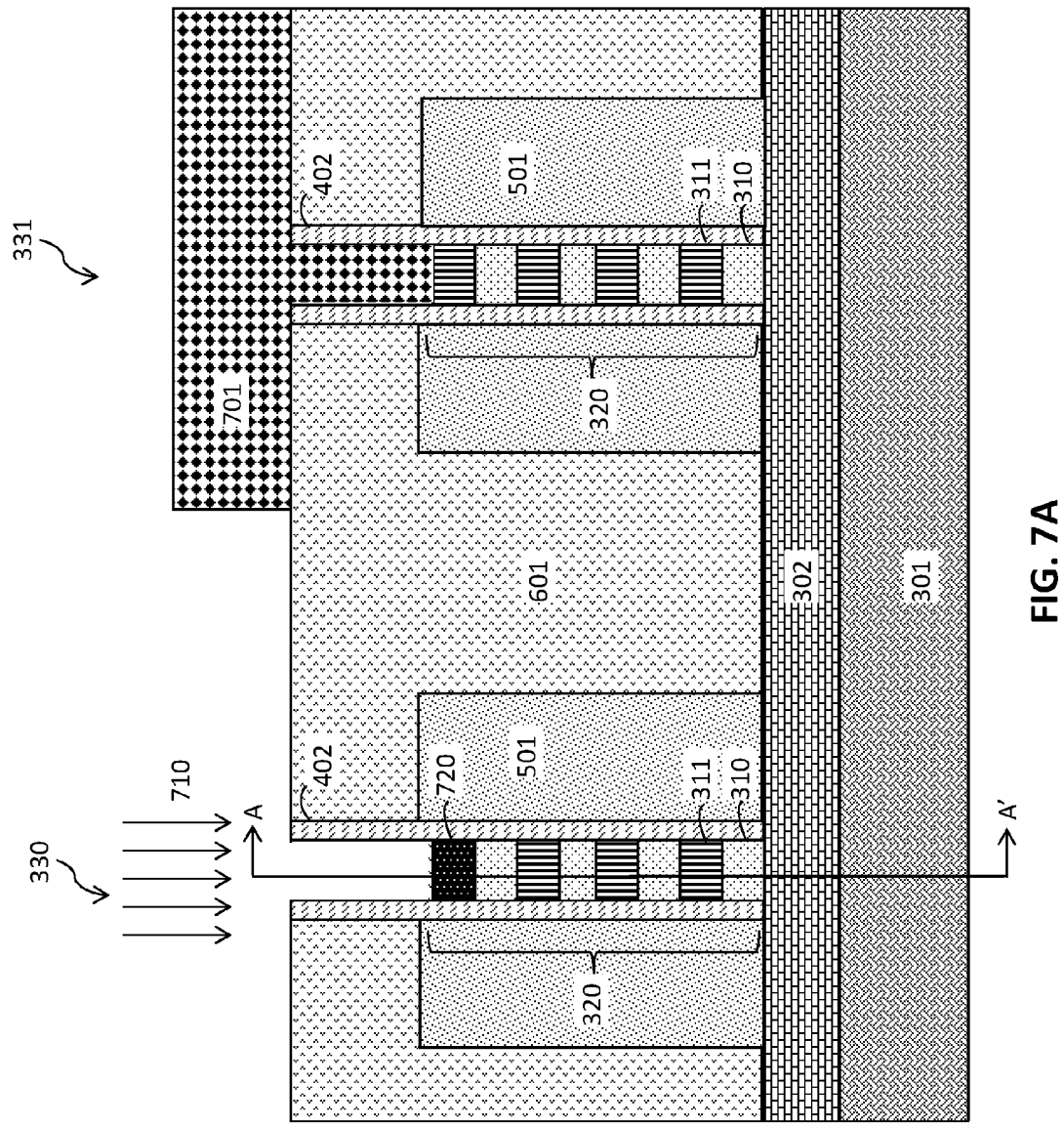
FIG. 7A is a cross-sectional side view after disposing a mask over the second nanowire FET and oxidizing a portion of the semiconducting stack of the first nanowire FET.
Figure 7B:
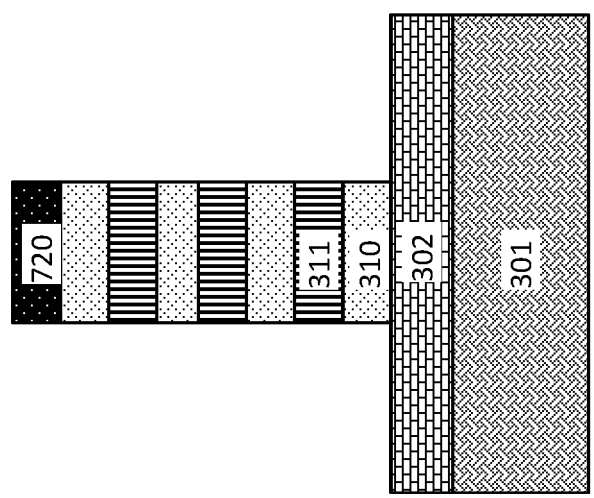
FIG. 7B is a cross-sectional side view through the A-A' axis of FIG. 7A.

FIG. 7A is a cross-sectional side view after disposing a mask 701 over the second transistor 331 and oxidizing a portion of the stack 320 (first nanowire stack) of the first transistor 330. FIG. 7B is a cross-sectional side view through the A-A' axis of FIG. 7A.

The mask 701 may be any protective material. The mask 701 may include a resist or a hard mask material. In other embodiments, the mask 701 is disposed over the first transistor 330, and the second transistor 331 stack 320 is oxidized.

In first transistor 330, a portion of the stack 320 within the gate spacers 402 is oxidized. The oxidized portion, including one or more semiconducting nanowires/material layers is electrically inactive. As shown in FIG. 7A, at least a first exposed layer of the stack 320 (a portion) is oxidized to convert a semiconducting nanowire (first and/or second semiconducting material 310, 311) to a dielectric material 720 (dielectric/non-semiconducting nanowire). As shown in FIG. 7A, the exposed second semiconducting material 311 is oxidized to form dielectric material 720. In other embodiments, first and second semiconducting materials 310, 311 are oxidized to form more than one dielectric material 720.

Any number of layers within the stack 320 of the first transistor 330 (e.g., 1, 2, 3, or more layers) may be oxidized from semiconducting materials (semiconducting nanowires) to dielectric materials (dielectric nanowires). The number of oxidized layers (depth of oxidation) depends on the oxidation process employed.

In one embodiment, a gas cluster ion beam (GCIB) process 710 may be employed to oxidize a semiconducting nanowire to a dielectric nanowire. Using a GCIB process to oxidize a portion of the stack 320 includes mixing a pressurized inert carrier gas composition with an oxidizing gaseous composition (e.g., a gaseous composition including oxygen gas). The gaseous mixture is flowed into a low pressure vacuum to produce a supersonic gas jet. The gaseous mixture expands in the jet to induce formation of inert gas clusters, oxygen atoms, and oxygen molecules. The clusters are ionized and focused into a cluster ion beam. The cluster ion beam is accelerated towards an exposed portion of the stack 320 within the gate spacers 402. The exposed portion of the stack, e.g., second semiconducting material 311 of the first transistor 330, is bombarded with ionized oxygen atoms and oxygen molecules. At least a portion of the surface of the stack 320 is oxidized.

Any inert gas may be used when GCIB is employed. Non-limiting examples of inert gases include neon (Ne) gas, argon (Ar) gas, krypton (Kr) gas, xenon (Xe) gas, or any combination thereof.

In some embodiments, the GCIB oxidation process is employed at room temperature. In other embodiments, the GCIB oxidation process is employed at a temperature in a range from about 0 to about 1000° C. The depth of the oxidation depends on the amount of time the stack 320 is exposed to the gas cluster ion beam.

In some embodiments, the depth of oxidation (portion of the stack 320 that is oxidized) is at least 1 nm. In other embodiments, from about 1 to about 100 nm of the stack 320 is oxidized.

Depending on the type of semiconducting material within the stack 320, the semiconducting materials/nanowires may be oxidized to different types of oxides. In some embodiments, second semiconducting material 311 includes silicon, and dielectric material 720 includes silicon dioxide. In other embodiments, second semiconducting material 311 includes silicon germanium, and dielectric material 720 includes silicon dioxide and germanium oxide.

The first semiconducting material 310 beneath dielectric material 720 may provide a margin for the oxidation process employed. When GCIB is used to oxidize second semiconducting material 311 to dielectric material 720, the first semiconducting material 310 functions as a margin or buffer layer that is later removed (see FIGS. 8A-8B below).

After being oxidized to a dielectric material 720, the first transistor includes a dielectric nanowire with a dielectric portion and a semiconducting portion. The semiconducting portion is outside the gate region beneath the active areas 501 (see FIGS. 4 and 5A). The dielectric portion is in the gate region between the spacers 402.

Figure 8A:
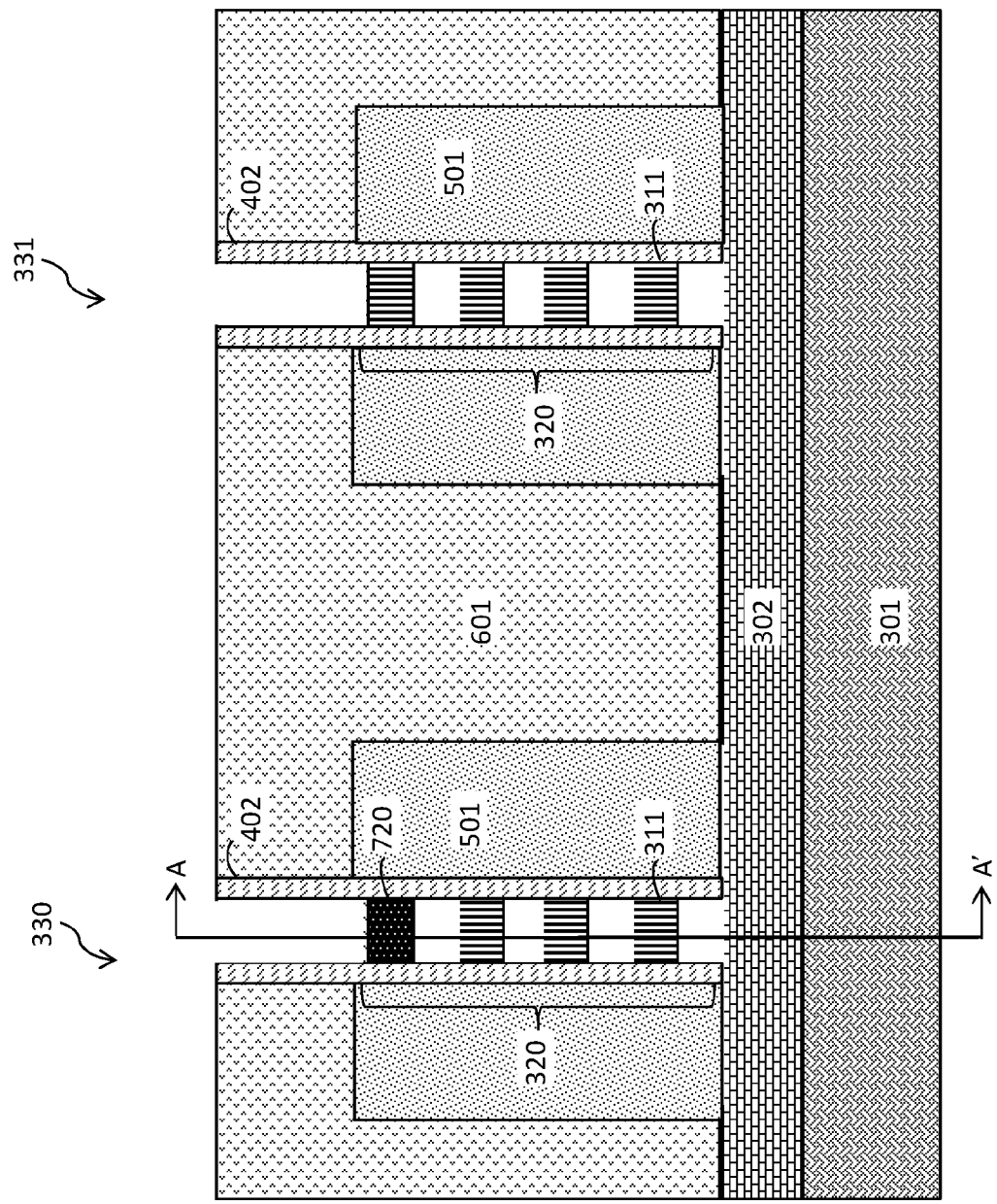
FIG. 8A is a cross-sectional side view after removing the mask and etching a portion of the semiconducting stacks.
Figure 8B:
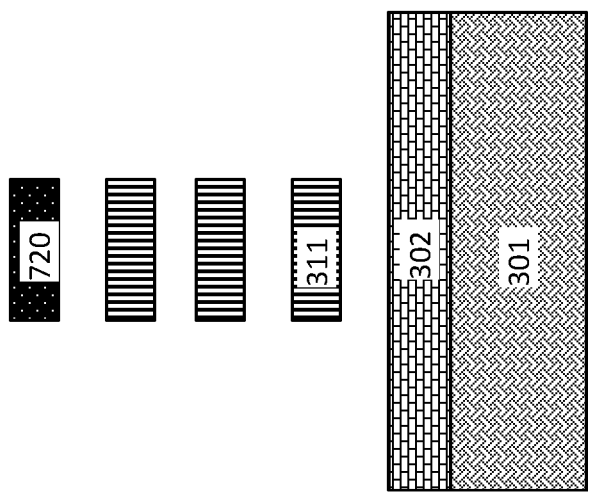
FIG. 8B is a cross-sectional side view through the A-A' axis of FIG. 8A.

FIG. 8A is a cross-sectional side view after removing the mask 701 over second transistor 331 and removing a portion of the semiconducting stacks 320 of the first and second transistors 330, 331. FIG. 8B is a cross-sectional side view through the A-A' axis of FIG. 8A.

A portion of the semiconducting stacks 320 of the first and second transistors 330, 331 may be removed by employing an etching process. One or more layers may be removed from the stack 320. A selective wet etching process may be used to remove the alternating first semiconducting material 310 from the stacks 320 of the first and second transistors 330, 331.

First transistor 330 then includes three layers of semiconducting nanowires (second semiconducting material 311) and one layer of a non-semiconducting nanowire (dielectric material 720). Second transistor 331 includes four layers of semiconducting nanowires (second semiconducting material 311). The second semiconducting material 311 remains anchored in the active areas 501. The dielectric material 720 also remains anchored in the active areas 501.

Non-limiting examples of suitable wet etchants for removing the first semiconducting material 310 include hydrofluoric acid (HF), hydrochloric acid (HCl), hydrofluoric nitric acid (HNA), phosphoric acid, hydrogen peroxide ($H_2O_2$), ammonium hydroxide ($NH_4OH$), suitable acids, suitable bases and any combination thereof.

Figure 9A:
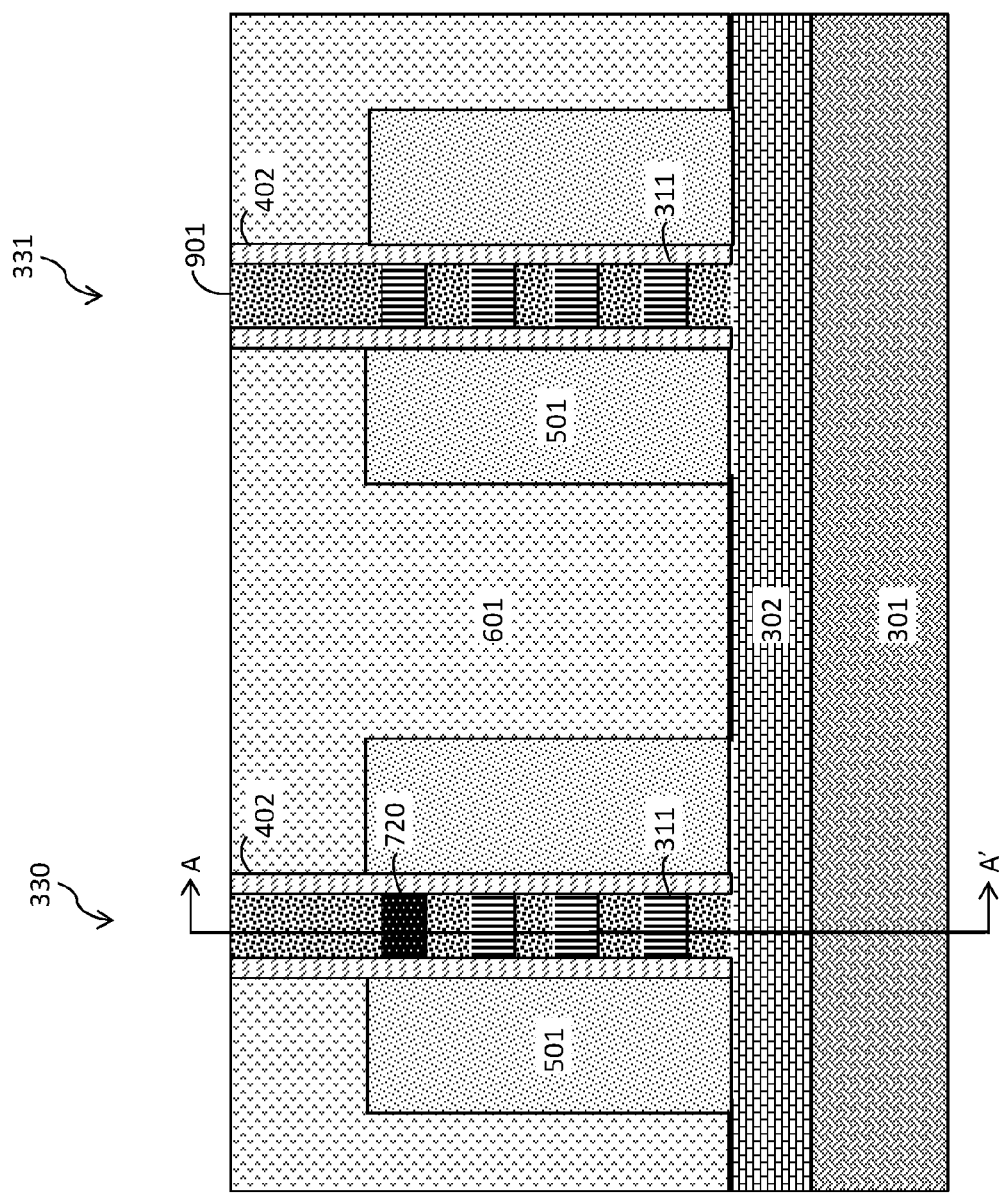
FIG. 9A is a cross-sectional side view after forming high-k metal gates.
Figure 9B:
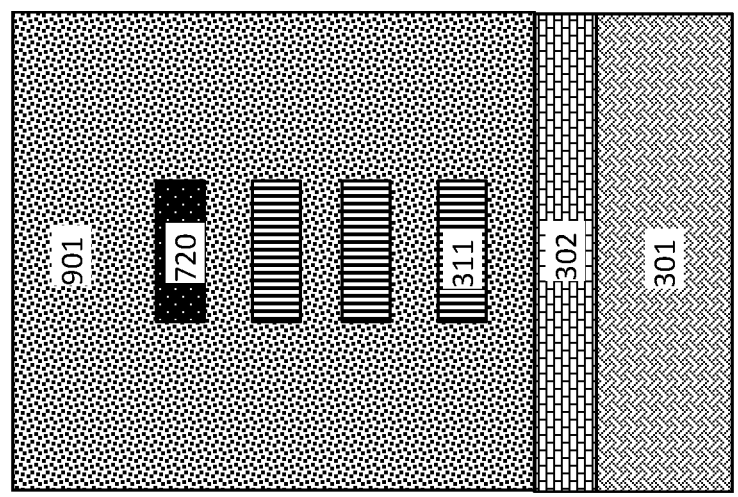

FIG. 9A is a cross-sectional side view after forming a high-k metal gate 901 within spacers 402. FIG. 9B is a cross-sectional side view through the A-A' axis of FIG. 9A.

The high-k metal gates 901 are formed, for example, by filling the gate region between the spacers 402 with one or more high-k dielectric materials, one or more work function metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal(s) depends on the type of transistor and may differ between the first and second transistors 330, 331. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and work function layer(s) to form the high-k metal gates 901. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal.

First transistor 330 and second transistor 331 include a different number of semiconductive nanowires. First transistor 330 includes three semiconductive nanowires (second semiconducting material 311 and dielectric material 720). Second transistor 331 includes four semiconductive nanowires (second semiconducting material 311). The number of nanowires that are non-semiconductive, or converted from a semiconductor to an inactive dielectric/oxide, can be tailored.

The nanowire stacks remain the same in the first and second transistors 330, 331 in the process flow until the dummy gate is replaced with the high-k metal gate. Maintaining the same nanowire stacks until the replacement gate process module minimizes the process variation due to different nanowire stacks.

As described above, various embodiments provide nanowire devices and methods of making nanowire devices with tunable effective device widths. Devices with tunable device widths are formed by converting one or more nanowires in a semiconducting stack into dielectric nanowires. In some embodiments, the semiconducting nanowires are converted to dielectric nanowires after dummy gate removal so that a majority of the front end of line (FEOL) processes remains undisrupted. In other embodiments, the nanowires are converted by performing a gas cluster ion beam (GCIB) process at room temperature. The thermal budget impact on junctions is minimized because high temperatures are not used.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a nanowire device, the method comprising:
    disposing a nanowire stack of a transistor over a substrate, the nanowire stack comprising alternating layers of a first semiconducting material and a second semiconducting material, the first semiconducting material contacting the substrate and the second semiconducting material being an exposed surface of the nanowire stack;
    forming a gate spacer along a sidewall of a gate region on the nanowire stack;
    oxidizing the exposed surface of the second semiconducting material of the nanowire stack within the gate spacer to form a dielectric nanowire; and
    removing, by a selective process, the first semiconducting material from the nanowire stack such that the second semiconducting material remains in the nanowire stack;
    wherein the dielectric nanowire is arranged on a plurality of semiconducting nanowires comprising the second semiconducting material, spaces are arranged between the semiconducting nanowires of the plurality of semiconducting nanowires, and a space is arranged between the plurality of semiconducting nanowires and the dielectric nanowire.

2. The method of claim 1, further comprising filling the gate region with a high-k metal gate material.

3. The method of claim 1, wherein the first semiconducting material comprises silicon germanium.

4. The method of claim 3, wherein the second semiconducting material comprises silicon.

5. The method of claim 1, wherein oxidizing a portion of the nanowire stack comprises a gas cluster ion beam process.

6. The method of claim 1, wherein oxidizing a portion of the nanowire stack comprises a room temperature oxidation process.

7. The method of claim 1, wherein oxidizing a portion of the nanowire stack comprises bombarding the nanowire stack with ionized oxygen atoms.

8. The method of claim 1, wherein oxidizing a portion of the nanowire stack comprises bombarding the nanowire stack with ionized oxygen molecules.

9. The method of claim 1, further comprising filling the gate region with a sacrificial gate material.

10. The method of claim 9, wherein the sacrificial gate material is amorphous silicon.

11. The method of claim 9, wherein the sacrificial gate material is polysilicon.

12. The method of claim 1, wherein the nanowire stack is disposed over an oxide layer that is arranged on the substrate.

13. The method of claim 1, further comprising forming a source region and a drain region are arranged on opposing sides of the gate region.

14. The method of claim 13, wherein the source region and the drain region comprise epitaxial growth.

15. The method of claim 1, wherein oxidizing a portion of the nanowire stack comprises a gas cluster ion beam process performed at room temperature.

16. The method of claim 1, wherein oxidizing a portion of the nanowire stack is performed at room temperature.

17. The method of claim 1, wherein oxidizing a portion of the nanowire stack converts a semiconducting material to a dielectric material.

18. The method of claim 17, wherein the dielectric material is a dielectric oxide.

19. The method of claim 17, wherein the dielectric material is a dielectric nanowire.

20. The method of claim 1, wherein oxidizing a portion of the nanowire stack converts a semiconducting material to a non-semiconducting material.

* * * * *